US006824827B2

(12) United States Patent
Katsuki et al.

(10) Patent No.: US 6,824,827 B2
(45) Date of Patent: Nov. 30, 2004

(54) METHOD OF MAKING A POLYIMIDE FILM HAVING A THIN METAL LAYER

(75) Inventors: Shozo Katsuki, Yamaguchi (JP); Toshihiko Anno, Yamaguchi (JP); Osamu Nakayama, Tokyo (JP); Hiroaki Yamaguchi, Tokyo (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 10/681,179

(22) Filed: Oct. 9, 2003

(65) Prior Publication Data

US 2004/0076765 A1 Apr. 22, 2004

Related U.S. Application Data

(62) Division of application No. 10/108,631, filed on Mar. 29, 2002, now abandoned.

(30) Foreign Application Priority Data

Mar. 29, 2001 (JP) ......................................... 2001-096253

(51) Int. Cl.$^7$ ................................................. B05D 3/10
(52) U.S. Cl. ........................ 427/307; 427/534; 427/535; 427/250
(58) Field of Search .............................. 427/307, 534, 427/535, 250

(56) References Cited

U.S. PATENT DOCUMENTS

| | | | |
|---|---|---|---|
| 4,543,295 A | 9/1985 | St. Clair et al. | |
| 5,373,629 A * | 12/1994 | Hupe et al. | ................... 29/852 |
| 5,462,628 A | 10/1995 | Viehbeck et al. | |
| 5,741,598 A | 4/1998 | Shiotani et al. | |
| 5,858,518 A | 1/1999 | Omote et al. | |
| 6,129,982 A | 10/2000 | Yamaguchi et al. | |
| 6,221,440 B1 | 4/2001 | Meyer et al. | |
| 6,245,432 B1 | 6/2001 | Funada et al. | |
| 6,379,784 B1 | 4/2002 | Yamamoto et al. | |
| 6,468,657 B1 * | 10/2002 | Hou et al. | ................. 428/403 |
| 6,537,411 B1 * | 3/2003 | Kang et al. | .............. 156/272.6 |
| 6,620,216 B2 * | 9/2003 | Oshima et al. | ................ 51/309 |
| 2001/0055691 A1 | 12/2001 | Yamamoto et al. | |
| 2002/0058149 A1 | 5/2002 | Yamamoto et al. | |
| 2002/0090524 A1 | 7/2002 | Yamamoto et al. | |

FOREIGN PATENT DOCUMENTS

| | | |
|---|---|---|
| JP | 3-180343 | 8/1991 |
| JP | 6-21157 | 1/1994 |
| JP | 6-021157 | 1/1994 |

* cited by examiner

*Primary Examiner*—Bret Chen
(74) *Attorney, Agent, or Firm*—Young & Thompson

(57) ABSTRACT

A method of surface treating a polyimide film to impart improved adhesion to metal which comprises treating the surface of a polyimide film having a biphenyltetracarboxylic acid component by contact to a solution containing potassium permanganate and/or sodium permanganate and potassium hydroxide and/or sodium hydroxide and treating said surface with an acid.

7 Claims, 1 Drawing Sheet

METHOD OF MAKING A POLYIMIDE FILM HAVING A THIN METAL LAYER

This application is a division of Application No. 10/108,631, filed on Mar. 29, 2002 now abandoned, the entire contents of which are hereby incorporated by reference.

BACKGROUND OF THE INVENTION

1. Field of the Invention

The present invention relates to an improvement in surface treatment of a polyimide film and to a polyimide film having a thin metal layer. More particularly, it relates to a method of surface treating a polyimide film to provide a thin metal layer-laminated polyimide film which exhibits improved peel strength and, even after heated or humidified, retains relatively high peel strength and to a polyimide film having a thin metal layer.

2. Description of the Related Art

Aromatic polyimide film is widely used in electronic equipment such as cameras, computers, and liquid crystal displays.

In applying an aromatic polyimide film as a substrate material of flexible printed wiring boards (FPCs), tape automated bonding (TAB) tape carriers, etc., copper foil is bonded to the aromatic polyimide film via an adhesive such as an epoxy resin adhesive.

Although the aromatic polyimide film is excellent in heat resistance, mechanical strength and electrical characteristics, the adhesive is inferior in heat resistance and the like. It follows that the copper/polyimide laminate fails to take the full advantage of the characteristics possessed by the polyimide.

To overcome this problem, adhesiveless all-polyimide copper clad laminates have been developed. All-polyimide copper clad laminates are prepared by (a) depositing such metal as nickel or chromium on polyimide by vapor deposition and then electroplating with copper, (b) applying a polyamic acid solution to copper foil, followed by drying and imidation, or (c) heat press bonding polyimide film and copper foil via thermoplastic polyimide. However, it has been pointed out that these all-polyimide copper clad laminates have small adhesion strength or impaired electrical characteristics.

A polyimide laminate having a polyimide adhesive between polyimide film and a copper layer is known (U.S. Pat. No. 4,543,295). This technique is unapplicable to a biphenyltetracarboxylic acid-based polyimide having a low coefficient of linear thermal expansion because of small adhesive strength achieved.

Therefore, it has been proposed to use in roll lamination a thermally fusible polyimide obtained by using a specific aromatic diamine. Nevertheless, the resulting polyimide copper clad laminates still tend to have small peel strength after allowed to stand in a humidifying condition. It has been sometimes impossible with these methods to reduce the thickness of a metal layer, or there has been difficulty in freely changing the thickness of a metal layer.

JP-A-6-21157 proposes an improved plating method, in which a polyimide film is rendered hydrophilic by surface treatment with an aqueous solution of a permanganate, such as sodium permanganate or potassium permanganate, or a hypochlorite, such as sodium hypochlorite or potassium hypochlorite. According to the publication, the treated polyimide film is electroless plated with nickel or cobalt to form a thin metal layer, which is, if desired, further electroless plated with copper, and a copper layer is formed thereon by electroplating to produce a copper-clad polyimide substrate. It is claimed that, when the copper-clad polyimide substrate is left to stand in a high temperature environment for a long time, the reduction in adhesion strength is negligible.

The polyimide film used in JP-A-6-21157 is Kapton (available from Du Pont-Toray Co., Ltd.) based on pyromellitic acid component. The p resent inventors have revealed that the surface treatment of JP-A-6-21157 produces no effect when applied to polyimide film based on a biphenyltetracarboxylic acid component.

SUMMARY OF THE INVENTION

An object of the present invention is to provide a method of surface treating a polyimide film to impart improved metal adhesion so that a thin metal layer-laminated polyimide film prepared by using the treated polyimide film retains relatively high peel strength even after left to stand in a heating or humidifying condition.

Another object of the present invention is to provide a polyimide film having a thin metal layer which comprises a polyimide film having been surface treated by the method and a thin metal layer formed on the treated side of the polyimide film.

The present invention relates to a method of surface treating a polyimide film having a biphenyltetracarboxylic acid component which comprises treating the surface of the film by contact to a solution, preferably immersion in a solution, containing at least one of potassium permanganate and sodium permanganate and at least one of potassium hydroxide and sodium hydroxide and treating the film surface with an acid thereby to improve the adhesion to metal.

The present invention also relates to a polyimide film having a thin metal layer which is composed of a polyimide film having been surface treated by the above-described method to have improved adhesion to metal and a metal layer formed on the surface-treated side of the polyimide film by vapor deposition or a combination of vapor deposition and plating.

It is important in the present invention that surface treatment of a polyimide film having a biphenyltetracarboxylic acid component with a solution containing potassium permanganate and/or sodium permanganate and potassium hydroxide and/or sodium hydroxide by immersion, spraying or a like application method be combined with acid treatment. A laminate obtained by forming a thin metal layer on the polyimide film having a biphenyltetracarboxylic acid component having been subjected to the combined treatments exhibits improved adhesion. Even after the laminate is allowed to stand in a heating or humidifying condition, reduction in peel strength is suppressed.

BRIEF DESCRIPTION OF THE DRAWINGS

The present invention will be more particularly described with reference to the accompanying drawings, in which.

DETAILED DESCRIPTION OF THE PREFERRED EMBODIMENTS

Figure 1:
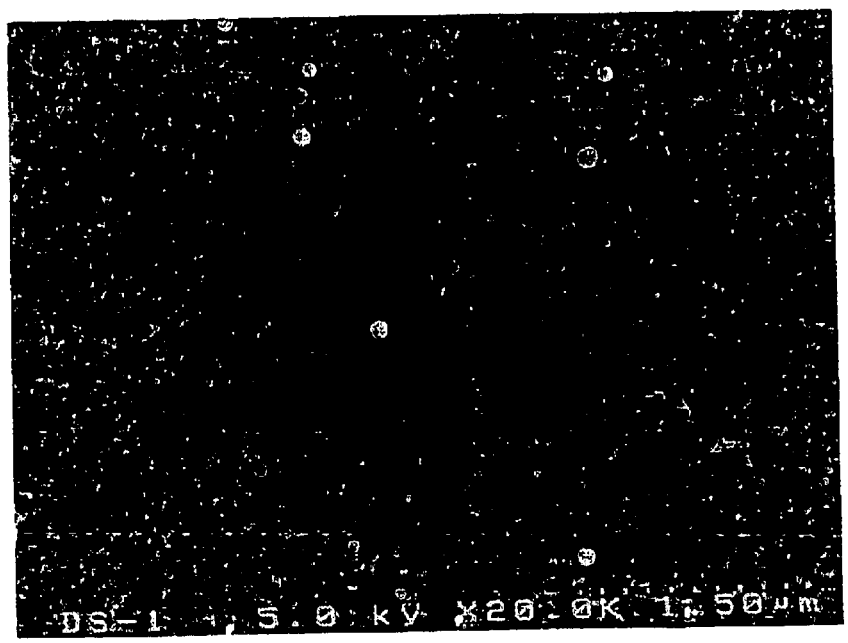
FIG. 1 is a scanning electron microscopic (SEM) image of a polyimide film having been subjected to surface treatment 1 in Example 1.

The present invention embraces the following preferred embodiments of the above-described surface treating method and polyimide film.

1) The surface treating method, wherein the contact treatment is carried out by immersing the polyimide film in an aqueous solution containing potassium permanganate and/or sodium permanganate in a total concentration of 10 to 100 g/l and potassium hydroxide and/or sodium hydroxide in a total concentration of 10 to 100 g/l at 20 to 85° C. for 10 to 600 seconds.
2) The surface treating method, wherein plasma treating the surface of the polyimide film is carried out after the acid treatment.
3) The surface treating method, wherein the polyimide film has a multilayer structure composed of a highly heat-resistant polyimide layer based on a biphenyltetracarboxylic acid component having on at least one side thereof a thermoplastic polyimide layer based on a biphenyltetracarboxylic acid component.
4) The polyimide film having a thin metal layer, wherein the thin metal layer has a three-layer structure composed of a first metal layer formed on the surface-treated side of the polyimide film by vapor deposition, a second metal layer formed on the first metal layer by vapor deposition and/or plating, and an outermost layer formed on the second metal layer by plating.
5) The polyimide film having a thin metal layer, wherein the first metal layer is made of nickel, chromium, cobalt, palladium, molybdenum, tungsten, titanium, zirconium or a nickel-copper alloy, the first metal layer has a thickness of 1 to 30 nm, the second metal layer is made of nickel, cobalt, a nickel-cobalt alloy or copper, the second metal layer has a thickness of 0.1 to 2.0 µm, and the outermost metal layer is a copper layer having a thickness of 0 to 20 µm.

The polyimide film which can be used in the present invention preferably includes a 5 to 120 µm thick film of a polyimide prepared from an acid component comprising 3,3',4,4'-biphenyltetracarboxylic acid dianhydride (hereinafter abbreviated as s-BPDA) and, if desired, pyromellitic dianhydride (hereinafter abbreviated as PMDA) and 3,3',4,4'-benzophenonetetracarboxylic acid dianhydride (hereinafter abbreviated as BTDA) and a diamine component comprising 4,4'-diaminodiphenyl ether (hereinafter abbreviated as DADE) and, if desired, p-phenylenediamine (hereinafter abbreviated as PPD). These types of polyimide will be referred to as an s-BPDA/DADE polyimide which means the polyimide comprises s-BPDA and DADE.

The polyimide may comprise other aromatic tetracarboxylic acid dianhydrides or other aromatic diamines, e.g., 4,4'-diaminodiphenylmethane, as far as the physical properties inherent to the above-described polyimide are not impaired.

The aromatic ring of the above-recited aromatic tetracarboxylic acid dianhydrides or aromatic diamines may have a substituent, such as a hydroxyl group, a methyl group or a methoxy group.

A particularly suitable polyimide film having a biphenyltetracarboxylic acid component is a multilayer polyimide film composed of a highly heat-resistant polyimide layer having on at least one side thereof a thermoplastic polyimide layer based on a biphenyltetracarboxylic acid component having a glass transition temperature (Tg) of 200 to 300° C.

In view of dimensional precision and rigidity, the multilayer polyimide film suitably has a layer structure in which the biphenyltetracarboxylic acid-based thermoplastic polyimide layer has a thickness of 1 to 10 µm, the highly heat-resistant polyimide layer has a thickness of 5 to 120 µm, and a total film has a thickness of about 7 to 125 µm.

The highly heat-resistant polyimide preferably has such heat resistance that a single film made of it has too high a Tg not to be confirmed in a temperature range below about 320° C., preferably below about 350° C. It is particularly preferred for the highly heat-resistant polyimide film to have a linear expansion coefficient of $5 \times 10^{-6}$ to $25 \times 10^{-6}$ cm/cm/° C. in a temperature range of 50 to 200° C. in both MD and TD and as an average of MD and TD.

Processes for the highly heat-resistant polyimide are not limited as long as the linear expansion coefficient and the Tg of film of the product fall within the above ranges. For example, the polyimide includes a random or block copolymer having an arbitrary tetracarboxylic acid component and an arbitrary aromatic diamine component at a mole ratio of approximately 1:1, a polymer blend comprising two or more kinds of polyimides, and a copolymer obtained by prepareing two or more kinds of polyamic acid solutions, mixing them, and allowing them to re-combine.

Particularly preferred highly heat-resistant polyimides are s-BPDA/PPD polyimides prepared from an acid component comprising s-BPDA and, if desired, PMDA and/or BTDA and a diamine component comprising PPD and, if desired, DADE.

The aromatic tetracarboxylic acid component providing the thermoplastic polyimide includes 2,3,3',4'-biphenyltetracarboxylic acid dianhydride (hereinafter abbreviated as a-BPDA) and s-BPDA. Part of the aromatic tetracarboxylic acid component can be displaced with PMDA, BTDA, etc.

The aromatic diamine component providing the thermoplastic polyimide includes flexible aromatic diamines having a plurality of benzene rings, such as DADE, 4,4'-diaminobenzophenone, 4,4'-diaminodiphenylmethane, 2,2-bis(4-aminophenyl)-propane, 1,3-bis(4-aminophenoxybenzene), 1,3-bis(3-aminophenoxybenzene), 1,4-bis(4-aminophenoxy)benzene, 4,4'-bis(4-aminophenyl) diphenyl ether, 4,4'-bis (4-aminophenyl)diphenylmethane, 4,4'-bis(4-aminophenoxy)diphenyl ether, 4,4'-bis (4-aminophenoxy)diphenylmethane, and 2,2-bis[4-(aminophenoxy)phenyl]propane.

Part of the aromatic diamine can be replaced with aliphatic diamines, such as 1,4-diaminobutane, 1,6-diaminohexane, 1,8-diaminooctane, 1,10-diaminodecane, and 1,12-diaminododecane, or diaminodisiloxanes, such as bis(3-aminopropyl) tetramethyl-disiloxane.

In order to block the amine terminal of the thermoplastic polyimide, it is possible to use dicarboxylic acids, such as phthalic anhydride and its derivatives, hexahydrophthalic anhydride and its derivatives, and succinic anhydride and its derivatives, especially phthalic anhydride.

In preparing the highly heat-resistant polyimide and the thermoplastic polyimide, the above-described acid and diamine components (and, if desired, other tetracarboxylic dianhydrides and other diamines) are allowed to react in an organic solvent at about 100° C. or lower, preferably 20 to 60° C., to prepare a polyamic acid solution, called a dope solution.

In the above reaction, the tetracarboxylic dianhydride and the dicarboxylic acid are preferably used in a total amount of 0.92 to 1.1 mol, particularly 0.98 to 1.1 mol, especially 0.99 to 1.1 mol, per mole of the total diamine component.

For the purpose of suppressing gelation of the polyamic acid, a phosphorous type stabilizers, such as triphenyl phosphite or triphenyl phosphate, can be added to the polyamic acid polymerization system in an amount of 0.01 to 1% by weight based on the solid content (polymer). For imidation acceleration a basic organic compound may be added to the dope solution as a catalyst. For example, imidazole, 2-imidazole, 1,2-dimethylimidazole, 2-phenylimidazole, etc. can be used in an amount of 0.01 to 20% by weight, particularly 0.5 to 10% by weight, based on the polyamic acid (solid content). Enabling polyimide film formation at relatively low temperature, the catalyst is used for avoiding insufficient imidation.

The dope solution for preparing a thermoplastic polyimide can further contain an organoaluminum compound, an inorganic aluminum compound or an organotin compound. For example, aluminum hydroxide, aluminum triacetylacetonate, etc. may be added in an amount of 1 ppm or more, particularly 1 to 1000 ppm, in terms of metallic aluminum, based on the polyamic acid (solid content).

The organic solvent used in the preparation of the polyamic acid, whether for the highly heat-resistant polyimide or for the thermoplastic polyimide, includes N-methyl-2-pyrrolidone, N,N-dimethylformamide, N,N-dimethylacetamide, N,N-diethyl-acetamide, dimethyl sulfoxide, hexamethylphosphoramide, N-methylcaprolactam, and cresols. These organic solvents can be used either individually or as a combination thereof.

The multilayer polyimide film is conveniently prepared by a coextrusion casting method. For example, a polyamic acid solution (dope) for a highly heat-resistant polyimide and a solution of a thermoplastic polyimide or a precursor thereof are co-extruded with the latter on one or both sides of the former and cast on a carrier, such as a mirror-finished stainless steel plate or belt, etc., and treated at 100 to 200° C. into a half-dried to half-cured state. The half-dried to half-cured state means a self-supporting film state resulting from heating and/or chemical imidation.

Coextrusion of a polyamic acid dope solution for a highly heat-resistant polyimide and that for a thermoplastic polyimide into a multilayer structure can be carried out by, for example, feeding the dopes to a three-layer coextrusion die and casting the extruded film on a carrier according to the technique disclosed in JP-A-3-180343.

The two- or three-layer extruded film is half-dried and then heated to further dry the film and induce imidation to provide a multilayer polyimide film composed of a highly heat-resistant polyimide layer (base layer) and a thermoplastic polyimide layer on at least one side, preferably both sides, of the base layer. The heating temperature is at or above the Tg of the thermoplastic polyimide and below a temperature causing deterioration of the thermoplastic polyimide, suitably 300 to 550° C. in terms of the surface temperature measured with a surface thermometer. At the heating temperature of 300 to 500° C., the heating time is preferably 1 to 60 minutes.

The highly heat-resistant polyimide base layer preferably has a thickness of 5 to 120 μm, desirably 5 to 70 μm, more desirably 5 to 40 μm. With the thickness of the base layer being smaller than 5 μm, the multilayer polyimide film may have insufficient mechanical strength or dimensional stability. Where the thickness of the base layer exceeds 120 μm, difficulties in solvent removal and imidation can result.

The thermoplastic polyimide layer or layers each preferably have a thickness of 1 to 10 μm, particularly 2 to 5 μm. A thickness smaller than 1 μm has reduced adhesion performance. A thickness greater than 10 μm is usable but produces no greater effects and rather results in reduction of heat resistance of the polyimide film.

The multilayer polyimide film preferably has a thickness of 7 to 125 μm, particularly 7 to 50 μm. A thinner film than 7 μm is difficult to handle. A thicker film than 125 μm tends to have difficulties in solvent removal and imidation.

Where the above-mentioned coextrusion casting method is followed, the base layer and the thermoplastic polyimide layer(s) can be adhered firmly to provide a multilayer construction exhibiting satisfactory electrical and mechanical characteristics.

According to the present invention, the surface of the polyimide film having the biphenyltetracarboxylic acid component is treated with a solution containing at least one of potassium permanganate and sodium permanganate and at least one of potassium hydroxide and sodium hydroxide by contact, preferably by immersion, and then treated with an acid.

The immersion treatment is preferably performed by immersing the polyimide film in an aqueous solution at 20 to 85° C. which contains potassium permanganate and/or sodium permanganate in a total concentration of 10 to 100 g/l and potassium hydroxide and/or sodium hydroxide in a total concentration of 10 to 100 g/l for about 10 to 600 seconds. Prior to the immersion treatment, the surface of the polyimide film can be swollen with a mixed aqueous solution containing diethylene glycol monobutyl ether (a concentration of the compound is, for example, 25% by weight), ethylene glycol (a concentration of the compound is, for example, 10% by weight), and 1 to 10 g/l of sodium hydroxide. The immersion treatment may be effected either continuously or batchwise, preferably continuously.

The immersion-treated polyimide film is then treated with an acid for neutralization. Acids to be used for the acid treatment are not particularly limited. Inorganic acids such as sulfuric acid, hydrochloric acid, and nitric acid, and organic acids such as acetic acid and formic acid are useful, with sulfuric acid being suitable. The acid treating conditions are not particularly limited, either. In using sulfuric acid, for example, the acid treatment is preferably carried out with 1 to 20%, particularly 5 to 10%, sulfuric acid at 5 to 80° C. for 1 second to 60 minutes. The acid-treated polyimide film is preferably washed with water.

Immediately before forming a thin metal layer on the thus treated polyimide film, it is a preferred embodiment to subject the film surface to plasma treatment to clean the surface and thereby to further improve the adhesion to metal. Plasma treatment is conveniently conducted by using helium, neon, argon, krypton, xenon, nitrogen or a mixed gas thereof under a pressure of 0.3 to 50 Pa, preferably 6 to 27 Pa. Argon gas is preferred for its low cost and high cleaning performance.

A thin metal layer can be formed on the treated side of the polyimide film, i.e., the side with improved adhesion to metal by vapor deposition or a combination of vapor deposition and electroless plating and/or electroplating to provide a polyimide film having a thin metal layer.

The thin metal layer provided on the surface-treated polyimide film can have a two-layer structure composed of a first metal layer formed on the surface-treated side of the polyimide film by vapor deposition and a second metal layer formed on the first metal layer by vapor deposition and/or plating. A third metal layer as an outermost layer can further be formed on the second metal layer by plating to make a three-layer structure.

The metal forming the first metal layer is required to provide good adhesion between the polyimide film and the second metal layer, involve no thermal diffusion, and to be strong and resistant against chemicals and heat. From this viewpoint, the metal is preferably at least one member selected from the group consisting of nickel, chromium, cobalt, palladium, molybdenum, tungsten, titanium, zirconium and a nickel-copper alloy.

Where the metal layer has a two- or three-layer structure, the first metal deposit layer preferably has a deposit thickness of 1 to 30 nm. Within this thickness range it is necessary to secure enhancement of adhesion and durability after thermal loading. If the deposit thickness is less than 1 nm, not only adhesion to the polyimide film but chemical resistance and heat resistance would be insufficient. If, on the other hand, the deposit thickness is greater than 30 nm, cohesive failure can happen inside the first metal layer, resulting in reduction of adhesion. Such a thick layer is also disadvantageous for etching efficiency.

According to the surface treating method of the present invention, a polyimide film can be provided with unevenness having a large number of projections and depressions as shown in the SEM image of FIG. 1. As a result, the metal vapor for forming the first metal deposit layer enters the depressions in the film thickness direction and deposit metal into the depressions to provide enhanced adhesion and durability after thermal loading. It is p referred for the metal vapor to enter at least 1 nm, particularly 2 nm or deeper from the surface of the polyimide film to deposit metal. The metal deposited into the surface depressions of the polyimide film is considered to produce anchoring effects for securing strength of the deposited layer.

Vapor deposition to form the first metal layer on one or both treated sides of the polyimide film is preferably carried out by vacuum evaporation, sputtering, ion plating, or ion-assisted deposition. The deposition chamber is preferably previously evacuated to a high degree of vacuum of $5 \times 10^{-4}$ Pa or lower. The gas pressure in sputtering is preferably 5 Pa or lower, still preferably $5 \times 10^{-1}$ Pa or lower, from the standpoint of processing stability and deposit film denseness. Usable gases for vapor deposition include rare gases, such as argon, neon, krypton, and helium, nitrogen, and hydrogen. Argon or nitrogen are preferred for their low cost.

In order to prevent moisture adsorbed on the film from oxidizing the metal layer and to improve denseness and uniformity of the metal layer, it is desirable that the polyimide film be pre-heated to 30 to 280° C., particularly 30 to 120° C., prior to vapor deposition. Heating temperatures above 280° C. can result in wrinkling during vapor deposition or blocking of the resulting laminates due to insufficient cooling after metal layer formation. The preheating may be done with a heating roll or a heater provided in front of a deposition chamber.

It is preferable that the polyimide film be subjected to plasma treatment after preheating and immediately before vapor deposition to clean the film surface and to improve adhesion to metal.

In case where copper is deposited on the first metal layer by vapor deposition to form the second metal layer, vapor deposition is carried out by sputtering, ion plating, electron beam evaporation or a like technique. The copper deposit layer preferably has a deposit thickness of 10 nm to 5 μm, particularly 100 to 500 nm. A thinner copper layer than 10 nm will fail to perform the full function as an undercoat for plating. A thickness exceeding 5 μm leads to increased cost.

Vapor deposition for the first metal layer and that for the second metal layer on a running polyimide film can be conducted either continuously or discontinuously. For example, a polyimide film having a first metal layer deposited thereon may be transported in a reverse direction and then subjected to second vapor deposition for forming a second metal layer. However, releasing the first metal layer from a vacuum system tends to involve oxidation of the first metal layer, which is unfavorable from the standpoint of adhesive strength.

The degree of vacuum in the second vapor deposition chamber is preferably previously set at $5 \times 10^{-5}$ Pa or lower.

In the case of sputtering, the gas pressure is preferably 5 Pa or lower, particularly $5 \times 10^{-1}$ Pa or lower, for processing stability and deposit film denseness. Usable gases for vapor deposition include rare gases, such as argon, neon, krypton, and helium, nitrogen, and hydrogen. Argon or nitrogen are preferred for their low cost.

The second metal layer can be plated with copper by electroless plating and/or electroplating to form a copper plating layer and thereby to provide a thickened conductive layer. The copper plating layer preferably has a thickness of 0 to 20 μm. A copper plating layer thicker than 20 μm can result in reduction of line width precision in high-density wiring. Such a thick copper layer is also disadvantageous for achieving weight and size reduction of electronic components to be mounted and from the economical consideration.

The polyimide film with a thin metal layer according to the present invention is used as such or in the form of roll. If necessary, it is subjected to various treatments such as etching and reverse curling treatment, and cut to size for use as a substrate of electronic components. For example, it is fit for use as a substrate of FPCs, TAB tape carriers, multilayer FPCs, and rigid-flex circuit boards.

The present invention will now be illustrated in greater detail with reference to Reference Example and Examples, but it should be understood that the invention is not construed as being limited thereto. Unless otherwise noted, all the percents are by weight. A peel strength of metal layer/polyimide laminates produced was measured as follows. Mechanical properties of the polyimide film prepared were measured according to ASTM D882.

Measurement of Peel Strength

A 10 mm wide test specimen was cut out of a thin metal layer/polyimide film laminate after being allowed to stand at room temperature for 24 hours, at 150° C. for 24 hours, at 200° C. for 24 hours, or at 121° C. and 100% RH under 2 atms. (pressure cooker test; PCT) for 24 hours, each after copper plating. The 90° peel strength of the specimen was measured at a pulling speed of 50 mm/min.

REFERENCE EXAMPLE 1

Preparation of Multilayer Polyimide Film

A dope solution for highly heat-resistant polyimide having a monomer concentration of 18% was prepared by polymerizing PPD and s-BPDA at a molar ratio of 1:1 in N-methyl-2-pyrrolidone. A dope solution for thermoplastic polyimide having a monomer concentration of 18% was prepared by polymerizing DADE and s-BPDA at a molar ratio of 1:1 in N-methyl-2-pyrrolidone. The two dope solutions were coextruded through a film forming apparatus equipped with a three-layer coextrusion die (multi-manifold die), cast on a metal-made carrier, and continuously dried with hot air at 150° C. to form a solid film. The cast film was stripped from the carrier and heated in a heating oven at a gradually elevated temperature of from 200° C. to 525° C. to remove the solvent and to imidate the polyimide precursor. The resulting three-layered polyimide film was wound into roll.

The resulting three-layered polyimide film had the following physical properties.

| | |
|---|---|
| Thickness structure: | 3 μm/44 μm/3 μm (50 μm in total) |
| Tg of thermoplastic polyimide: | 275° C. |
| Volume resistivity: | $>1 \times 10^{15}$ Ω · cm |

Coefficient of linear thermal expansion (50 to 200° C.): $10 \times 10^{-6}$ to $20 \times 10^{-6}$ cm/cm/° C. in both MD and TD.

EXAMPLE 1

1) Treatment 1

The multilayer polyimide film prepared in Reference Example 1 was immersed in an aqueous solution containing 60 g/l of potassium permanganate and 45 g/l of sodium hydroxide for 1 minute, washed with water, neutralized with a 50 ml/l sulfuric acid aqueous solution, and washed with water. The SEM image of the treated side of the polyimide film is shown in FIG. 1.

2) Treatment 2

The film having been treated by treatment 1 was set on a substrate holder in a sputtering chamber. After evacuating the chamber to a pressure of $2 \times 10^{-4}$ Pa or lower, argon was introduced to a pressure of 0.67 Pa. A 13.56 MHz radiofrequency power of 500W was applied to the electrodes to generate plasma to give 1 minute plasma cleaning to the film surface.

3) Formation of Thin Metal Layer

Consecutively, chromium and then copper were deposited in an argon atmosphere of 0.67 Pa to a deposit thickness of 10 nm and 0.4 µm, respectively, and the film was taken out of the chamber. The copper layer was plated with copper by electroplating in an acid copper sulfate aqueous solution to a deposit thickness of 20 µm.

The results of peel test of the metal layer/polyimide laminate are shown in Table 1 below.

EXAMPLES 2 AND 3

A metal layer/polyimide laminate was obtained in the same manner as in 25 Example 1, except for prolonging the immersion time of treatment 1 to 3 minutes (Example 2) or 5 minutes (Example 3). The results of peel test of the resulting laminates are shown in Table 1.

COMPARATIVE EXAMPLE 1

Figure 2:
FIG. 2 is an SEM image of an untreated polyimide film in Comparative Example 1.

A metal layer/polyimide laminate was obtained in the same manner as in Example 1, except that treatment 1 was not carried out (treating time: 0 min). The SEM image of the polyimide film before metal layer formation is shown in FIG. 2.

As shown in Table 1, the peel strength, which was initially 0.86 kg/cm, remarkably reduced after the laminate was left to stand under conditions of 150° C.×24 hrs, 200° C.×24 hrs, or PCT conditions (121° C., 100% RH, 2 atms.×24 hrs).

TABLE 1

|  | Treating Time (min) | Peel Strength (kg/cm) (10 mm width; 90° peel) | | | |
| --- | --- | --- | --- | --- | --- |
|  |  | Initial | 150° C. × 24 hrs | 200° C. × 24 hrs | PCT × 24 hrs |
| Comparative Example 1 | 0 | 0.86 | 0.10 | 0.12 | 0.72 |
| Example 1 | 1 | 1.80 | 1.25 | 1.20 | 1.38 |
| Example 2 | 3 | 1.65 | 0.85 | 0.96 | 1.09 |
| Example 3 | 5 | 1.63 | 0.80 | 0.84 | 1.10 |

COMPARATIVE EXAMPLE 2

Kapton H, a polyimide film available from Du Pont-Toray Co., Ltd., was surface treated in the same manner as in Example 1. However, the film surface underwent considerable dissolution in treatment 1 so that further treatment was impossible.

As described above, the present invention provides a biphenyltetracarboxylic acid-based polyimide film with improved adhesion. The polyimide film of the invention provides a thin metal layer/polyimide film laminate which undergoes reduced reduction in peel strength even when allowed to stand under a heating or humidifying condition (each peel strength is not less than 0.5 kg/cm). The polyimide film having a thin metal layer according to the present invention retains relatively high peel strength even when allowed to stand under a heating or humidifying condition.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

This application claims the priority of Japanese Patent Application No. 2001-96253 filed Mar. 29, 2001, which is incorporated herein by reference.

What is claimed is:

1. A method of producing a polyimide film having a thin metal layer, the polyimide film having a biphenyltetracarboxylic acid component and having a linear expansion coefficient of $5 \times 10^{-6}$ to $25 \times 10^{-6}$ cm/cm/° C. in a temperature range of 50 to 200° C. in both MD and TD, the method consisting essentially of the steps of:

treating the surface of the polyimide film by contact to a solution containing at least one of potassium permanganate and sodium permanganate and at least one of potassium hydroxide and sodium hydroxide and treating the surface with an acid;

plasma treating the surface of the polyimide film after the acid treatment to improve adhesion to metals; and forming the thin metal layer on the treated side of said polyimide film by vapor deposition or a combination of vapor deposition and plating, a peel strength of the polyimide film having the thin metal layer being not less than 0.5 kg/cm even when allowed to stand under a heating at 150° C. for 24 hours, when tested for a specimen having a three-metal-layer structure.

2. The method according to claim 1, wherein said thin metal layer has a three-layer structure composed of a first metal layer formed on the surface-treated side of the polyimide film by vapor deposition, a second metal layer formed on said first metal layer by vapor deposition and/or plating, and an outermost metal layer formed on said second metal layer by plating.

3. The method according to claim 2, wherein said first metal layer is made of at least one member selected from the group consisting of nickel, chromium, cobalt, palladium, molybdenum, tungsten, titanium, and zirconium, said first metal layer has a thickness of 1 to 30 nm, said second metal layer is made of nickel, cobalt, a nickel-cobalt alloy or copper, and said second metal layer has a thickness of 0.1 to 2.0 µm.

4. The method according to claim 2, wherein the peel strength is not less than 0.5 kg/cm even when allowed to stand under a heating at 150° C. for 24 hours, 200° C. for 24 hours and 121° C. for 24 hours at 100% RH under 2 atms.

5. The method according to claim 2, wherein said outermost metal layer is a copper layer having a thickness of not more than 20 μm.

6. The method according to claim 1, wherein the treating step is carried out by immersing the polyimide film in an aqueous solution containing at least one of potassium permanganate and sodium permanganate in a total concentration of 10 to 100 g/l and at least one of potassium hydroxide and sodium hydroxide in a total concentration of 10 to 100 g/l at 20 to 85° C. for 10 to 600 seconds.

7. The method according to claim 1, wherein said polyimide film has a multilayer structure composed of a highly heat-resistant polyimide layer based on a biphenyltetracarboxylic acid and component having on at least one side thereof a thermoplastic polyimide layer based on a biphenyltetracarboxylic acid component.

* * * * *